(12) United States Patent
Kretz et al.

(10) Patent No.: US 6,665,583 B2
(45) Date of Patent: Dec. 16, 2003

(54) ARTICLE HOLDERS WITH SENSORS DETECTING A TYPE OF ARTICLE HELD BY THE HOLDER

(75) Inventors: Frank E. Kretz, Santa Clara, CA (US); Alexander J. Berger, Palo Alto, CA (US); Sean A. Casarotti, Morgan Hill, CA (US)

(73) Assignee: Tru-Si Technologies, Inc., Sunnyvale, CA (US)

( * ) Notice: Subject to any disclaimer, the term of this patent is extended or adjusted under 35 U.S.C. 154(b) by 0 days.

(21) Appl. No.: 10/265,056

(22) Filed: Oct. 4, 2002

(65) Prior Publication Data

US 2003/0040837 A1 Feb. 27, 2003

Related U.S. Application Data

(62) Division of application No. 09/904,638, filed on Jul. 13, 2001, now Pat. No. 6,615,113.

(51) Int. Cl.7 .................................................. G06F 7/00
(52) U.S. Cl. ...................... 700/218; 700/258; 700/259; 901/46; 901/47; 414/796; 414/811; 414/941
(58) Field of Search .............................. 700/213, 218, 700/295, 258, 259; 901/2, 9, 30, 46, 47; 419/796, 416.03, 811, 935, 936, 937, 938, 941

(56) References Cited

U.S. PATENT DOCUMENTS

| | | | |
|---|---|---|---|
| 3,438,668 A | 4/1969 | Olsson et al. ............. 294/64.3 |
| 3,945,505 A | 3/1976 | Frisbie et al. ............ 214/1 BB |
| 4,029,351 A | 6/1977 | Apgar et al. ................. 294/64 |
| 4,566,726 A | 1/1986 | Correnti et al. ........... 294/64.3 |
| 4,773,687 A | 9/1988 | Bush et al. ................. 294/64.1 |
| 4,881,863 A | 11/1989 | Braginsky ................... 414/225 |
| 5,004,399 A | 4/1991 | Sullivan et al. ............. 414/729 |
| 5,044,752 A | 9/1991 | Thurfjell et al. ............. 356/400 |
| 5,169,196 A | 12/1992 | Safabakhsh ................ 294/64.3 |
| 5,375,291 A | 12/1994 | Tateyama et al. ............. 15/302 |
| 5,445,486 A | 8/1995 | Kitayama et al. ........... 414/416 |
| 5,452,078 A | 9/1995 | Cheng ......................... 356/150 |
| 5,456,179 A | 10/1995 | Lamelot ...................... 102/213 |
| 5,539,323 A | 7/1996 | Davis, Jr. ................... 324/690 |
| 5,540,098 A | 7/1996 | Ohsawa ......................... 73/629 |
| 5,546,179 A | 8/1996 | Cheng .......................... 356/73 |
| 5,556,147 A | 9/1996 | Somekh et al. ............. 294/64.1 |
| 5,622,400 A | 4/1997 | George ....................... 294/64.1 |
| 5,642,980 A * | 7/1997 | Tacchi et al. ............. 414/796.9 |
| 5,647,626 A | 7/1997 | Chen et al. ................. 294/87.1 |
| 5,669,752 A | 9/1997 | Moon .......................... 414/783 |
| 5,738,486 A * | 4/1998 | Schroeder .................... 414/796 |
| 5,746,460 A | 5/1998 | Marohl et al. ............... 294/1.1 |
| 5,765,889 A | 6/1998 | Nam et al. .................. 294/64.1 |
| 5,811,827 A * | 9/1998 | Pryor et al. ............. 250/559.31 |
| 5,863,170 A | 1/1999 | Boitnott et al. ............. 414/222 |
| 5,870,488 A | 2/1999 | Rush et al. .................. 382/151 |
| 5,967,578 A | 10/1999 | Frey .......................... 294/64.3 |
| 6,013,920 A | 1/2000 | Gordon et al. ......... 250/559.36 |
| 6,075,375 A | 6/2000 | Burkhart et al. ............. 324/758 |
| 6,095,582 A | 8/2000 | Siniaguine et al. ......... 294/64.3 |
| 6,099,056 A | 8/2000 | Siniaguine et al. ......... 294/64.3 |
| 6,109,677 A | 8/2000 | Anthony .................... 294/103.1 |
| 6,113,165 A | 9/2000 | Wen et al. .................... 294/1.1 |
| 6,139,678 A | 10/2000 | Siniaguine ................... 156/345 |
| 6,164,894 A | 12/2000 | Cheng ......................... 414/416 |
| 6,168,697 B1 | 1/2001 | Siniaguine et al. ..... 204/298.15 |
| 6,174,011 B1 | 1/2001 | Keigler ........................ 294/99.1 |
| 6,176,023 B1 | 1/2001 | Doche .......................... 34/451 |
| 6,183,026 B1 | 2/2001 | Cai et al. ................... 294/64.1 |

(List continued on next page.)

Primary Examiner—Khoi H. Tran
(74) Attorney, Agent, or Firm—Michael Shenker; MacPherson Kwok Chen & Heid LLP (57) ABSTRACT

An article holder has sensors that detect whether an article held in the holder is a workpiece or a piece of packaging material. Examples are end effectors suitable for picking up semiconductor wafers and packaging material from a pod or some other carrier.

10 Claims, 6 Drawing Sheets

U.S. PATENT DOCUMENTS

| | | |
|---|---|---|
| 6,183,183 B1 | 2/2001 | Goodwin et al. ............ 414/217 |
| 6,184,060 B1 | 2/2001 | Siniaguine ................. 438/106 |
| 6,187,103 B1 | 2/2001 | Huang et al. ............... 118/728 |
| 6,198,976 B1 | 3/2001 | Sundar et al. ................ 700/59 |
| 6,199,927 B1 | 3/2001 | Shamlou et al. ........... 294/64.1 |
| 6,202,482 B1 | 3/2001 | Blew et al. ................... 73/159 |
| 6,206,441 B1 | 3/2001 | Wen et al. ................... 296/1.1 |
| 6,217,034 B1 | 4/2001 | Smedt et al. ............... 279/106 |
| 6,220,808 B1 | 4/2001 | Bonora et al. .............. 414/217 |
| 6,244,641 B1 | 6/2001 | Szapucki et al. .......... 294/64.1 |
| 6,427,991 B1 | 8/2002 | Kao ............................ 269/21 |
| 2002/0113321 A1 | 8/2002 | Siniaguine |

* cited by examiner

ARTICLE HOLDERS WITH SENSORS DETECTING A TYPE OF ARTICLE HELD BY THE HOLDER

CROSS REFERENCE TO RELATED APPLICATIONS

The present application is a division of U.S. patent application Ser. No. 09/904,638 filed on Jul. 13, 2001, was in U.S. Patent No. 6,615,113, incorporated herein by reference.

BACKGROUND OF THE INVENTION

The present invention relates to article handling, and more particularly to article holders that handle semiconductor wafers and other articles.

Figure 1:
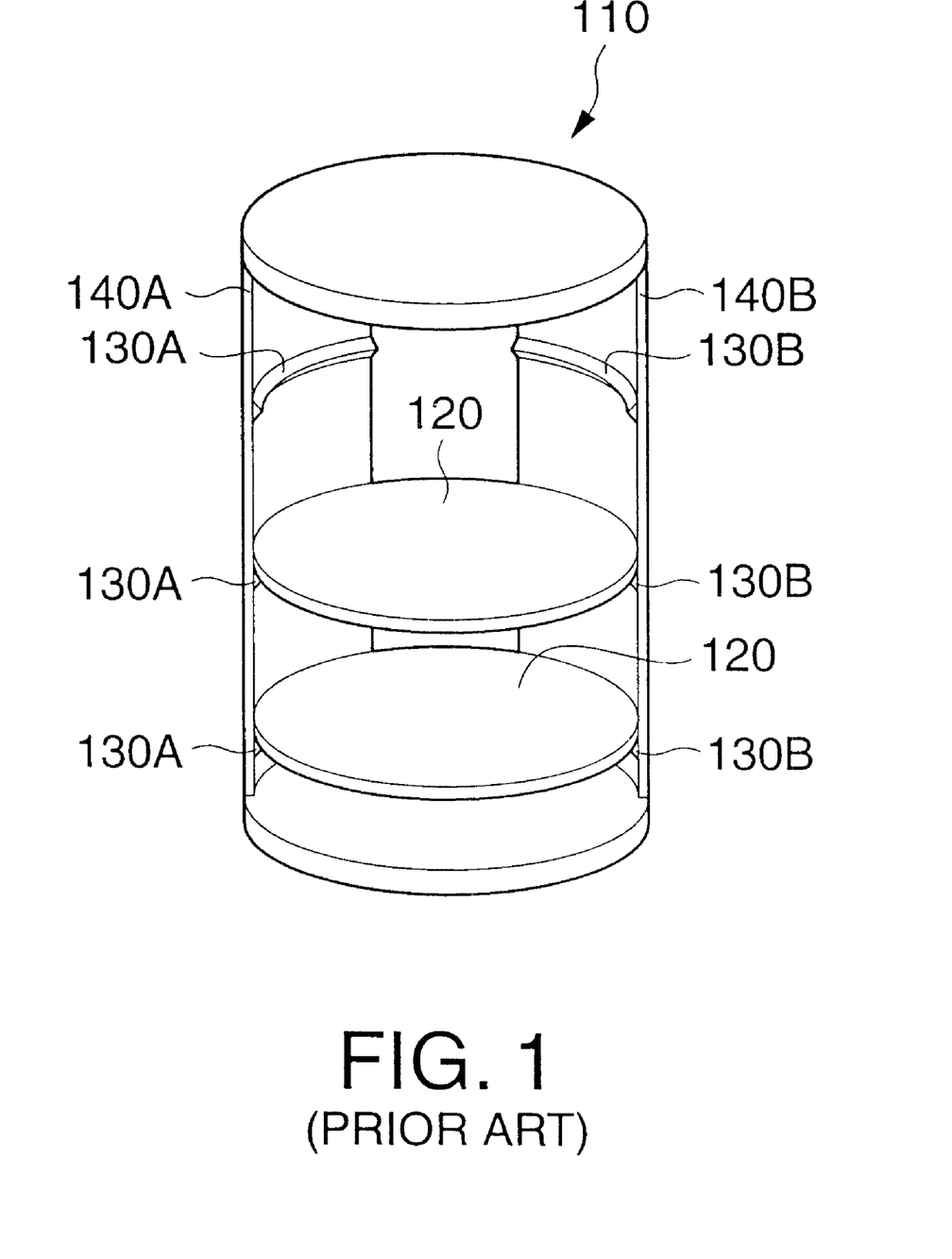
FIG. 1 is a perspective view of a conventional wafer storage cassette.

During fabrication of integrated circuits from semiconductor wafers, the wafers are stored and transported in cassettes. FIG. 1 illustrates a cassette 110 holding a number of wafers 120. Each wafer rests on shoulders 130A, 130B formed on cylindrical cassette walls 140A, 140B. A robot (not shown) transports the wafers between the cassette and wafer processing equipment. An article holder ("end effector") mounted on a robot arm holds the wafers by vacuum or electrostatic forces, or using a gas vortex, or by other means.

When a wafer is thin (below 100 $\mu$m), the wafer is difficult to store in a cassette. The wafer sags under its own weight, and can fall off the cassette shoulders 130A, 130B. A thin wafer can also be warped due to the internal stresses caused by the presence of different materials (semiconductor materials, metals, dielectrics) which constitute the wafer circuitry. Therefore, thin wafers have been stored in horizontal wafer shipment containers ("pods"), such as pod 210 in FIG. 2. Wafers 120 are stacked in the pod on top of each other, with paper or plastic inserts 220 separating the wafers. Foam 230 is provided at the top and bottom of the stack (the top piece of foam is not shown). The foam and the paper or plastic inserts have roughly the same shape as the wafers, and most or all of the bottom surface of each wafer is in physical contact with the paper inserts above and below the wafer. The wafer circuitry is protected however. A typical fabrication process starts with fairly thick wafers (e.g. 600 to 800 $\mu$m for silicon wafers) which are stored in a cassette. When the wafer circuitry has been fabricated and a protective passivation layer has been formed on the circuitry side of the wafer, the wafer is thinned down from the other side to a final thickness (which may be 100 $\mu$m or less), and is stored in a pod. At this stage, the wafer circuitry is protected by the passivation layer, so the physical contact between the wafer 120 and the paper or plastic 220 is acceptable.

It is desirable to provide wafer handling techniques suitable for storage of wafers in pods.

SUMMARY

Figure 2:
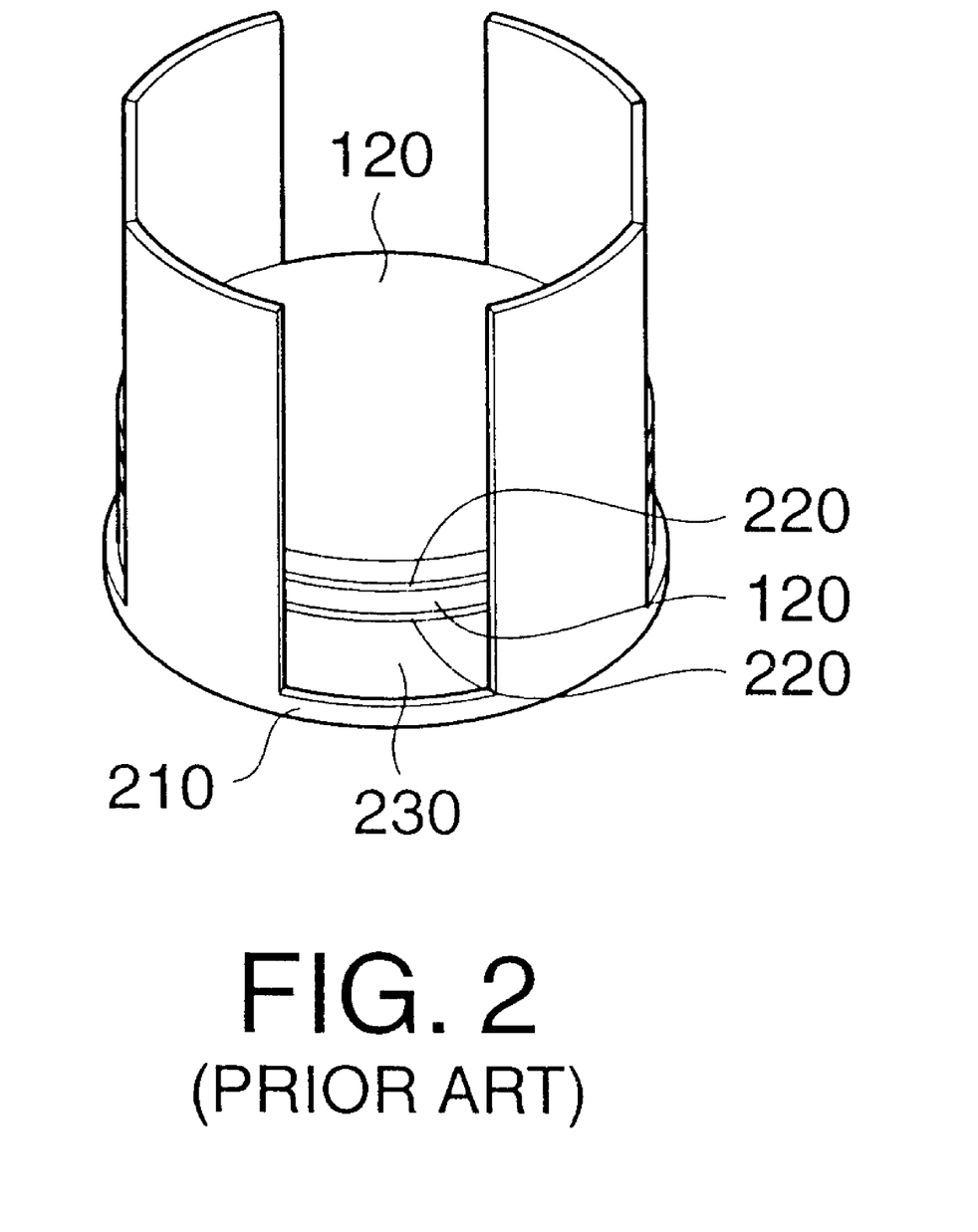
FIG. 2 is a perspective view of a conventional pod for storing semiconductor wafers.

The present invention provides end effectors suitable for handling of wafers stored in pods such as pod 210 of FIG. 2. The end effectors have sensors that allow automatic detection of whether an article held by the end effector is a wafer or a piece of packaging material, e.g. paper or plastic, or foam. Some embodiments can handle wafers stored in pods as well as wafers stored in cassettes.

The invention is not limited to thin wafers, and is applicable to thick wafers stored in pods or cassettes. The invention is also applicable to containers other than pods and cassettes.

The invention is not limited to semiconductor wafers. Some embodiments include article holders that handle glass or polymer wafers, or wafers made from other materials. In some embodiments, the articles handled by the end effector are multiple wafers bonded together. Such articles can be formed in the process of manufacture of vertically integrated circuits. See U.S. Pat. No. 6,184,060 issued Feb. 6, 2001 to O. Siniaguine and incorporated herein by reference. An article may include a combination of semiconductor and non-semiconductor wafers. See U.S. patent application Ser. No. 09/791,977 filed on Feb. 22, 2001 by O. Siniaguine and incorporated herein by reference. In other embodiments, the articles are flat-panel displays or other types of articles extending generally along a plane. Packaging materials other than paper or foam can be used.

The invention is not limited to article holders that are part of a robot. Some embodiments include hand-held article holders, or article holders mounted on non-electronically-controlled machinery. The invention is defined by the appended claims.

DESCRIPTION OF PREFERRED EMBODIMENTS

Figure 3:
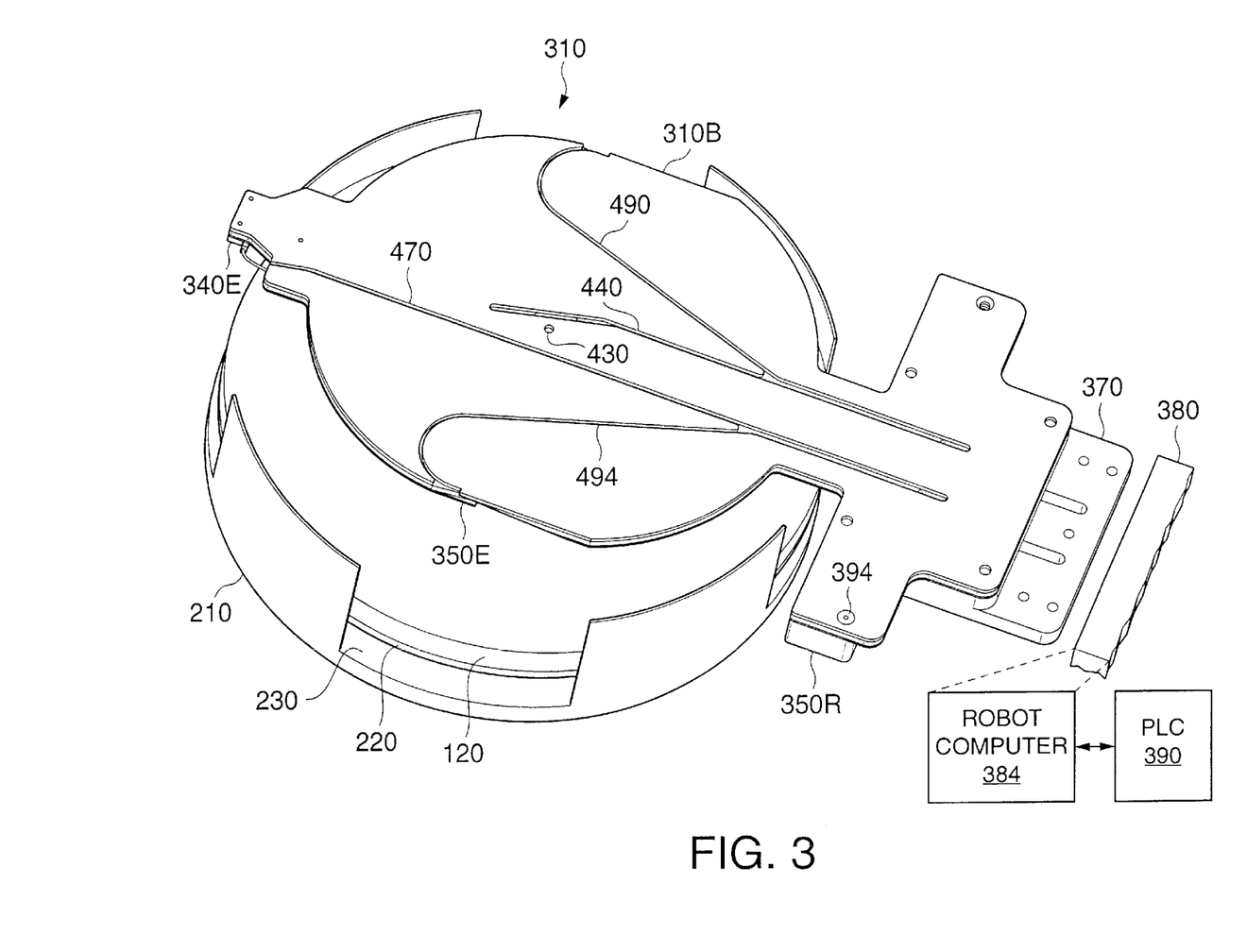
FIGS. 3, 4 are perspective views showing an end effector according to one embodiment of the present invention.
Figure 4:
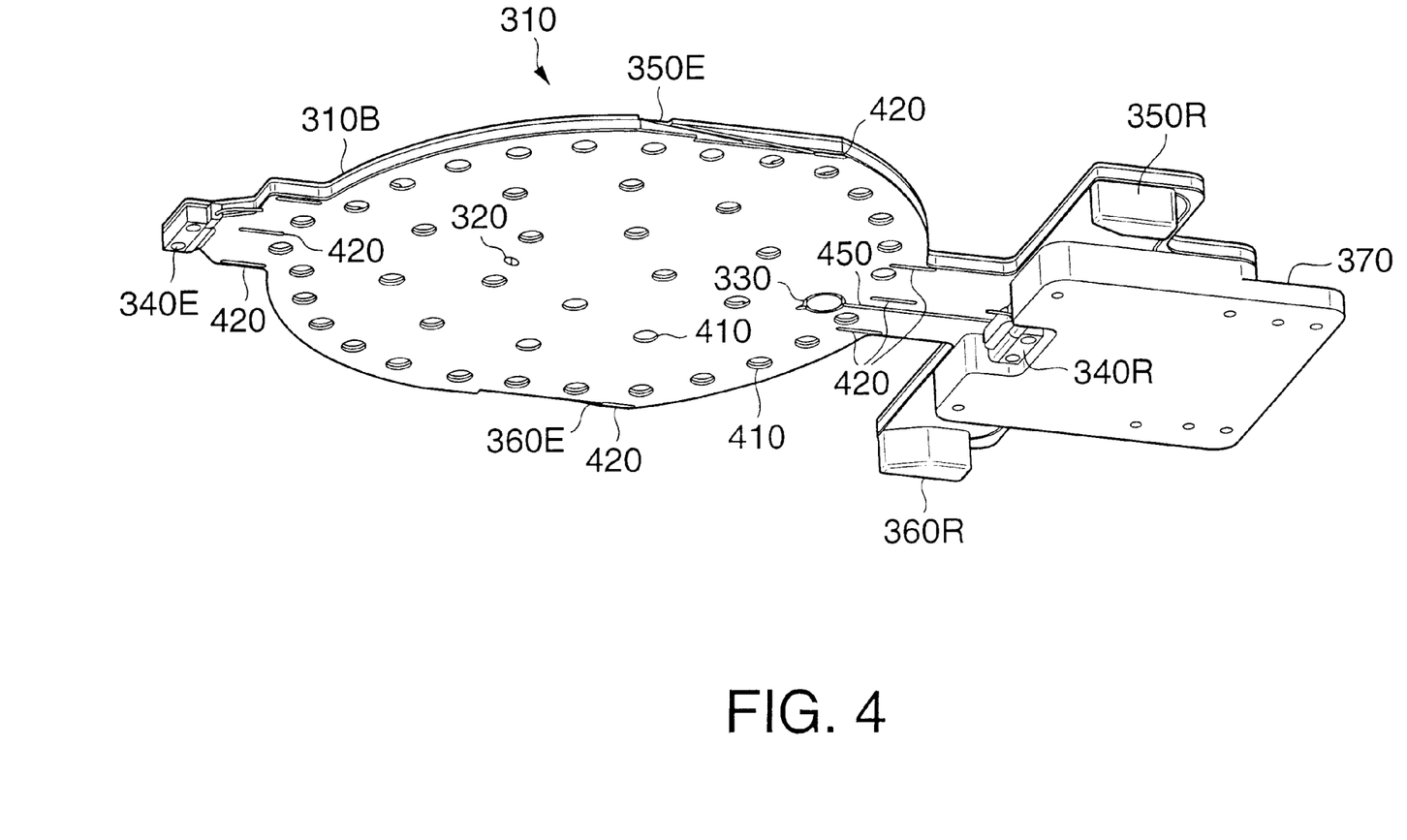
Figure 5:
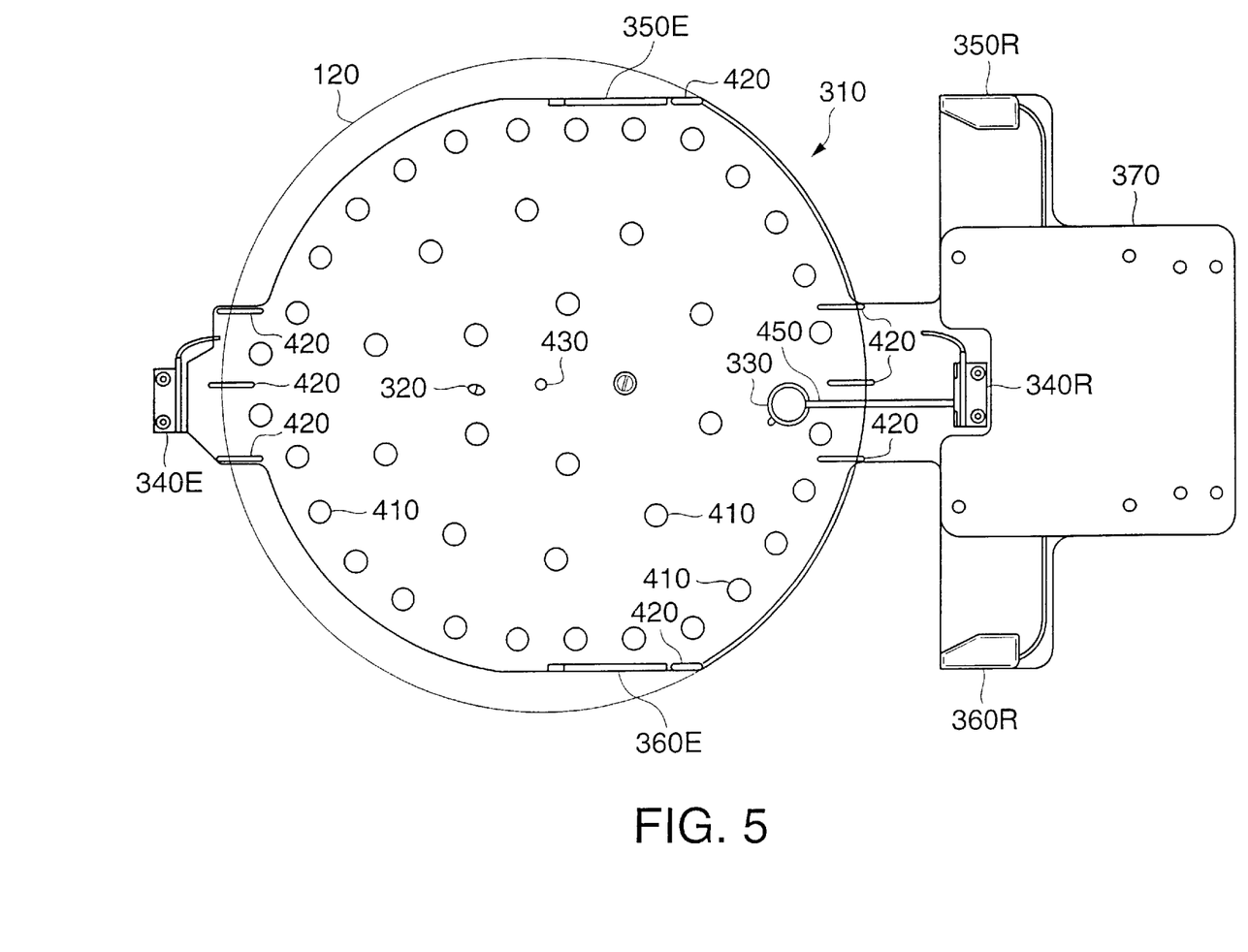
FIG. 5 is a bottom view showing the end effector of FIGS. 3, 4.

FIG. 3 is a perspective view showing the top and a side of an end effector 310 according to one embodiment of the present invention. FIG. 4 is a perspective view showing the same side and the bottom of the end effector. FIG. 5 is a plan bottom view. The end effector is suitable for picking up wafers 120, paper 220 and foam 230 from pod 210, and for placing wafers, paper and foam in the pod. The end effector can also place wafers in, and pick up wafers from, a cassette 110 (FIG. 1). The end effector has a color sensor 320, a capacitance sensor 330, a top of stack sensor 340 (shown as an emitter/receiver pair 340E, 340R), a sensor 350 (shown as an emitter/receiver pair 350E, 350R), and a sensor 360 (shown as emitter 360E, receiver 360R). These sensors are used to detect whether the end effector is holding a wafer, a paper insert, or foam. These sensors are also used to detect the presence of a wafer in a cassette and whether or not the wafer is cross slotted.

The end effector is mounted on an adaptor 370 attached to a robot arm 380 (FIG. 3). The robot can be a conventional robot, for example, model GBY7S available from Genmark Automation of Sunnyvale, Calif. The robot may be controlled by its computer 384 which receives commands from a programmable logic controller (PLC) 390. The robot receives signals from the sensors, sends them to the PLC, and performs actions as directed by its computer 384 and the PLC. The invention is not limited to robots, PLCs, adaptors, or any particular end effector control techniques. FIGS. 3–5 also show mounting holes (such as 394) and screws that hold the structure together. Such mounting means are not limiting.

The end effector of FIGS. 3–5 is a non-contact type. It holds articles with gas vortices emitted from openings 410 (FIGS. 4, 5) in its bottom surface. Only a few of the openings are labeled in the drawings. Gas vortex end effectors are described in U.S. Pat. No. 6,095,582 issued Aug. 1, 2000 to Siniaguine et al. and incorporated herein by reference. See also U.S. patent application Ser. No. 09/632,236 filed Aug. 4, 2000 by S. Casarotti et al.; U.S. patent application Ser. No. 09/633,086 filed Aug. 4, 2000 by S. Kao; U.S. patent application Ser. No. 09/877,366 entitled "Article Holders That Use Gas Vortices To Hold An Article In A Desired Position", filed Jun. 8, 2001 by S. Kao. In an exemplary embodiment, the end effector has a body 310B made of a top plate and a bottom plate. A number of vortex chucks are positioned in a hollow region (not shown) between the two plates. Gas is supplied under pressure into the hollow region. The gas enters the vortex chucks, and exits in vortices through openings 410 in the bottom plate. The gas vortices create an attraction force that holds the wafer, paper, or foam article near the body of the end effector. The gas also creates a cushion that prevents the article from touching the bottom surface of the end effector except at break pads 420. Break pads 420 protrude from the bottom surface of the end effector to prevent the article from sliding laterally. The article is pressed against the break pads by the attraction force of the gas vortices. FIG. 5 shows at 120 a contour of a wafer held in the end effector. The paper and foam occupy a similar position. The invention is not limited to gas vortex end effectors, break pads, or end effectors made of two plates.

Color sensor 320 allows the end effector to distinguish between a wafer 120 and a paper or plastic insert 220. Color sensor 320 includes an emitter and a receiver, and generates a binary signal indicating whether or not the color of the article held by the end effector is the color of paper 220. In some embodiments, the inserts are black, the wafers are gray, and the color sensor generates a signal indicating the presence of the black color. In other embodiments, the sensor 320 generates a signal indicating the presence of the gray color. In some embodiments, the sensor is programmable to indicate the presence of a color programmed into the sensor. Such color sensors are known. One example is model CZ-K1 available from Keyence Corporation of Woodcliff Lake, N.J. Other embodiment use sensors that generate a non-binary signal whose value indicates which of a set of colors the sensor has detected.

In FIGS. 3–5, the color sensor 320 is mounted in a hole passing through the body of the end effector. Sensor 320 is connected to the robot by means of a fiber optic conduit 440 (FIG. 3) that houses two fiber optic cables, one cable for the emitter of the sensor and the other cable for the receiver. Fiber optic conduit 440 is positioned in a groove in the top surface of the end effector body 310B. The invention is not limited to such conduits, or a particular position of the conduits, or any other construction. For example, conduit 440 can be positioned between the top and bottom plates of the end effector, or under the bottom plate, and can be a non-fiber-optic wire.

Capacitance sensor 330 (FIGS. 4, 5) is a redundant sensor provided, like the color sensor, to distinguish between a wafer 120 and a paper or plastic insert 220. Capacitance sensor 330 is positioned on the bottom surface of the end effector, and is connected to the robot by means of a cable 450. Such sensors are known, and one example is model SK-25-10/25-b available from SIE Sensors of Toledo, Ohio. The control logic (e.g. computer robot 384 and/or PLC 390) can be programmed to recognize a wafer when both of the sensors 320, 330 indicate a wafer, or at least one of the two sensors indicates a wafer, or when one specific sensor (e.g. the color sensor) indicates a wafer. Similarly, the control logic can be programmed to recognize a paper or plastic insert or foam when at least one of the two sensors, or a specific one of the two sensors, or both, indicate a paper insert or foam. (In some embodiments, the foam is detected by sensor 340 as described below, and the sensors 320, 330 are not used for foam detection.) The control logic can be programmed to generate an alarm signal when the sensor data are inconsistent, e.g. one of the sensors 320, 330 indicates a wafer and the other one of the sensors 320, 330 indicates paper or plastic.

Additional redundant sensors can be provided, which recognize articles based on physical properties other than color or capacitance. For example, magnetic properties can be exploited. Other embodiments do not have redundant sensors, for example, only a capacitance sensor or only a color sensor is provided. Multiple sensors of the same type, e.g., multiple color sensors, can be provided. Their signals can be averaged.

In some embodiments, the sensors 320, 330 are flush with the bottom surface of the end effector body 310B to provide a smooth surface which is easy to clean and which does not accumulate particles.

Top of stack sensor 340 (shown as an emitter/receiver pair 340E, 340R) detects the top article in pod 210 and/or cassette 110 when the end effector is not holding any article and is moving down searching for the top article to pick up. When the end effector has picked up the article, sensor 340 is used to determine whether or not the article is foam 230. Sensor 340 is also used when the end effector is placing a wafer 120 or an insert 220 into a pod or a cassette. As explained below, the wafers and the inserts do not block the sensor 340, so the sensor can detect the top of stack in the pod with a wafer or insert in the end effector. When the top of stack is detected, the end effector can place the wafer article or the insert article on the stack and release the article.

Figure 6:
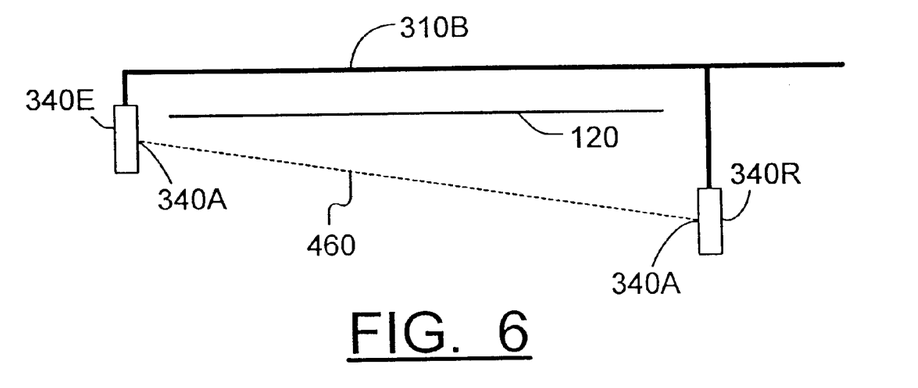
FIGS. 6–8 are side views showing the end effector of FIGS. 3–5.
Figure 7:
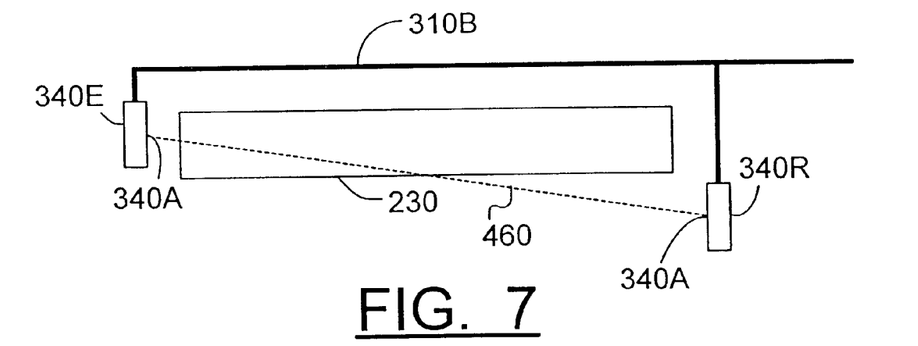

Sensor 340 is a thru-beam sensor. Emitter 340E is mounted on the "nose" of the end effector (the nose is the part away from the robot). Receiver 340R is mounted on the "tail" of the end effector (close to the robot). When the end effector picks up an article (wafer, paper or foam), the article is between emitter 340E and receiver 340R. See FIG. 5 showing the contour of wafer 120. See also FIG. 6 showing schematically a side view of the end effector holding a wafer 120. A wafer 120 or a paper or plastic insert 220 are closer to the end effector body 310B than the light apertures 340A of emitter 340E and receiver 340R. (The term "light aperture" is used herein for the light emitting area of the emitter and the light detecting area of the receiver respectively.) Therefore, a wafer or a paper or plastic insert will not break a beam of light 460 from emitter 340E to receiver 340R. Foam 230 is thicker and will break the beam, as shown in FIG. 7. In some embodiments, wafers 120 and inserts 220 are at most 0.6 mm thick. The "flying gap" (the distance between the wafer or insert article and the end effector body 310B) is at most 0.5 mm. Foam pieces 230 are about 3 mm to 26 mm thick. Emitter 340E protrudes down less than receiver 340R in order to make the end effector thinner at the nose. The thinner nose makes it easier for the end effector to enter cassette 110. In some embodiments, sensor 340 is model FU-16 available from Keyence Corporation. The aperture 340A is at the center of emitter 340E, and is 1.27 mm below the end effector body 310B. Aperture 340A of receiver 340R is at the center of the receiver, and is 7.62 mm below the body 310B. These dimensions are not limiting. In some embodiments, the emitter and receiver apertures 340A are equidistant from body 310B, so beam 460 is horizontal. Therefore, when the end effector is looking for the top of stack, and the beam is broken, the distance between the article breaking the beam and the body 310B is precisely determined by the robot.

In some embodiments, the receiver protrudes down less or by the same amount as the emitter. In some embodiments, the emitter is positioned at the tail of the end effector, and the receiver is at the nose, and the receiver may or may not protrude down less than the emitter. The emitter and receiver position can be chosen as needed for a particular application. For example, if the end effector is used with plasma processing equipment, it may be desirable to position the receiver so as to minimize disturbance of the sensor by the light emitted by the plasma.

FIG. 3 shows a fiber optic cable 470 used to connect the transmitter 340E to the robot. Cable 470 is positioned in a groove in the top surface of the end effector body. This construction is not limiting.

The invention is not limited to thru-beam sensors or to particular positioning of the sensor elements. For example, a retroreflective sensor can be used.

Figure 8:
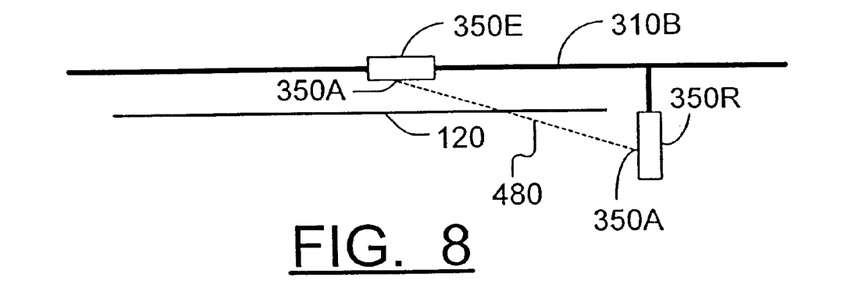

Sensor 350 (shown as an emitter/receiver pair 350E, 350R) helps detect the presence of an article in the end effector. Emitter 350E is positioned on a side of the end effector body 310B. When the end effector is holding an article, light aperture 350A of emitter 350E is above the article. See FIG. 8. Receiver 350R is positioned on the tail portion of the end effector, laterally to the side of the article. Light aperture 350A of receiver 350R is below the top surface of the article. Any article held by the end effector, including a wafer, a paper insert, or foam, will break the beam 480 from the emitter to the receiver. FIG. 8 schematically illustrates this for a wafer 120.

The position of emitter 350E and receiver 350R can be interchanged.

Fiber optic cable 490 (FIG. 3) is used to connect the emitter 350E to the robot. Cable 490 is positioned in a groove in the top surface of the end effector body. This construction is not limiting.

Sensor 360, shown in FIGS. 4, 5 as an emitter/receiver pair 360E, 360R, is similar. It detects the article on the other side of the end effector. When the end effector is holding an article, the light aperture of emitter 360E is above the article. Receiver 360R is positioned on the tail portion of the end effector, away from the position of the article. The receiver's light aperture is below the top surface of the article. Any article held by the end effector, including a wafer, a paper insert, or foam, will break the beam from the emitter to the receiver.

The position of emitter 360E and receiver 360R can be interchanged.

Fiber optic cable 494 (FIG. 3) is used to connect the emitter 360E to the robot. Cable 494 is positioned in a groove in the top surface of the end effector body. This construction is not limiting.

In some embodiments, sensors 350, 360 are positioned to detect some types of articles (e.g. foam) but not other types.

In some embodiments, sensors 350, 360 are used to detect a wafer in cassette 110. When one of these sensors detects a wafer and the other one of these sensors does not, the wafer may be broken or cross-slotted. See the aforementioned U.S. patent application Ser. No. 09/632,236.

Sensors 350, 360 can be conventional devices, such as model FX-7 available from SUNX Ltd. of West Des Moines, Iowa. They can also be retroreflective or other types of sensors. The invention is not limited to the positioning of these sensors on the end effector.

Sensor 340 can be used with sensors 350, 360 to detect the presence of an article lying in a cassette or a pod before the article is picked up by the end effector. Sensor 340 can also be used to detect an article after the article is picked up. Sensor 340 can detect the middle of the article, and each of sensors 350, 360 can detect one side of the article. If the sensors' signals are inconsistent, i.e., only one or two of the three sensors detect an article, the article may be broken.

How the sensors are used depends on the programming of robot computer 384 and PLC 390. For the purpose of illustration and not to limit the invention, Table 1 below shows one possible use of the sensors. In the embodiment of Table 1, color sensor 320, capacitance sensor 330, and top of stack sensor 340 are ignored when a wafer is picked up or placed in a cassette. Each sensor provides a binary detection signal, i.e. detect or no detect. Color sensor 320 detects the color of inserts 220. Capacitance sensor 330 detects the wafer capacitance. In Table 1, "D" means detection, "ND" means no detection, "X" means "don't care".

TABLE 1

| Condition | Sensor 350 | Sensor 360 | Top of Stack 340 | Color 320 | Cap. 330 |
|---|---|---|---|---|---|
| End Effector Clear | ND | ND | ND | ND | ND |
| Wafer Present | D | D | ND | ND | D |
| Paper or Plastic Present | D | D | ND | D | ND |
| Foam Present | X | X | D | X | X |
| Top of Stack Found | X | X | D | X | X |
| Wafer cross slotted (if being taken from a cassette) or broken (if picked up and held in the end effector) | D | ND | X | X | X |
| Wafer cross slotted (if being taken from a cassette) or broken (if picked up and held in the end effector) | ND | D | X | X | X |

In some embodiments, inconsistent signals are taken as indications of a broken wafer. For example, a piece of a wafer may block both of the sensors 350,360, thus indicating a good wafer, but color sensor 320 or capacitance sensor 330 may indicate no wafer, thus signaling a broken wafer. Pieces of a broken wafer may move one over another in the end effector, blocking the top of stack sensor 340. When different color sensors and/or different capacitance sensors are present, inconsistent signals from such sensors may also indicate a broken wafer. The robot can be programmed to put broken wafers into a specially designated area.

The invention is not limited to the embodiments described above. Other types of sensors, for example, CCD cameras, can be used. The invention is applicable to article holders that hold an article from below or at some angle. Other embodiments and variations are within the scope of the invention, as defined by the appended claims.

What is claimed is:

1. An article handling method comprising:
   picking up an article by an article holder having one or more sensors; and having the one or more sensors generate one or more signal indicating whether the article is a workpiece or a piece of packaging material.

2. The article handling method of claim 1 wherein the one or more signals include a signal indicative of a color of the article.

3. The article handling method of claim 1 wherein the one or more signals include a signal indicative of a capacitance of the article.

4. The article handling method of claim 1 wherein the one or more signals include a signal indicative of a thickness of the article.

5. The article handling method of claim 1 wherein picking up the article comprises picking up the article from a container for storing workpieces and pieces of packaging material, each workpiece lying on a piece below.

6. The article handling method of claim 1 wherein the one or more sensors indicate whether or not the article is broken.

7. The article handling method of claim 1 wherein the one or more sensors indicate whether or not the article is a semiconductor wafer.

8. The article handling method of claim 1 wherein the article is picked up with one or more gas flows emitted from the article holder towards the article.

9. The article handling method of claim 8 wherein each gas flow is a vortex.

10. The article handling method of claim 1 wherein the one or more signals are provided to a computer system which uses the one or more signals to determine if the article is broken.

* * * * *